United States Patent
Wang

(10) Patent No.: US 9,520,851 B2
(45) Date of Patent: Dec. 13, 2016

(54) PREDICTIVE AUTOMATIC GAIN CONTROL IN A MEDIA PROCESSING SYSTEM

(71) Applicant: Kirusa, Inc.

(72) Inventor: Yuchen Wang, Nanchang (CN)

(73) Assignee: KIRUSA, INC., New Providence, NJ (US)

( * ) Notice: Subject to any disclaimer, the term of this patent is extended or adjusted under 35 U.S.C. 154(b) by 89 days.

(21) Appl. No.: 14/645,430

(22) Filed: Mar. 12, 2015

(65) Prior Publication Data

US 2015/0381131 A1    Dec. 31, 2015

Related U.S. Application Data

(60) Provisional application No. 62/017,536, filed on Jun. 26, 2014.

(51) Int. Cl.
*H03G 3/00* (2006.01)
*H03G 3/30* (2006.01)
*G10L 21/0316* (2013.01)

(52) U.S. Cl.
CPC .......... *H03G 3/3089* (2013.01); *H03G 3/3005* (2013.01); *G10L 21/0316* (2013.01)

(58) Field of Classification Search
CPC ............................ G10L 21/0316; H03G 3/001
USPC .................................................. 381/104, 107
See application file for complete search history.

(56) References Cited

U.S. PATENT DOCUMENTS

2008/0235011 A1* 9/2008 Archibald ............... G10L 25/78
   704/225
2009/0010453 A1* 1/2009 Zurek ................. G10L 21/0208
   381/94.5

* cited by examiner

*Primary Examiner* — Paul S Kim
*Assistant Examiner* — Katherine Faley
(74) *Attorney, Agent, or Firm* — Ash Tankha; Lipton, Weinberger & Husick

(57) ABSTRACT

A method and a media processing system (MPS) for automatic gain control are provided. The MPS detects a portion of an input signal corresponding to a measurement window associated with a predetermined time interval and determines a peak value of the input signal during a first predetermined time segment within the measurement window. The MPS determines a number of occurrences of the peak value during a second predetermined time segment within the measurement window and compares the determined number of occurrences of the peak value with a predefined range of occurrences for identifying a speech portion or a non-speech portion of the input signal corresponding to the measurement window. The MPS adjusts a gain corresponding to the first predetermined time segment based on the peak value, upon identifying the speech portion. The MPS iteratively performs the method by shifting the measurement window in steps of the first predetermined time segment.

20 Claims, 6 Drawing Sheets

PREDICTIVE AUTOMATIC GAIN CONTROL IN A MEDIA PROCESSING SYSTEM

CROSS-REFERENCE TO RELATED APPLICATIONS

This application claims priority to and the benefit of provisional patent application No. 62/017,536 titled "Predictive Automatic Gain Control In A Media Processing System", filed in the United States Patent and Trademark Office on Jun. 26, 2014. The specification of the above referenced patent application is incorporated herein by reference in its entirety.

BACKGROUND

The embodiments herein generally relate to multimedia processing, and more particularly, to gain control in a media processing system.

Automatic gain control (AGC) is a technique used in audio systems, for example, voice messaging systems to adjust gain to an appropriate level for a given input signal. An average or peak output signal level is used to adjust the gain to a suitable level, thus, enabling the audio systems to work satisfactorily within a greater range of input signal levels. However, typical AGC systems may be incapable of providing optimal gain control for voice signals that comprise both speech portions and non-speech portions such as background noise and silence that can vary from one user to another user. For instance, in real time communications such as during an ongoing call or during live video conferencing on a mobile communication device, the AGC system must react immediately to changes in signal levels.

In non-real time communications such as while retrieving offline voice messages or while playing an audio file, the amount of time available for gain adjustment is more than in the case of real time communications. Despite the availability of substantially more time for gain adjustment, current approaches for non-real time communications do not make use of the available time for gain adjustment, thus resulting in poor feedback to the AGC system and a poorly controlled signal output. To reduce overall output noise, it may be desirable to adjust the gain of the input signal early in the signal path to subsequently improve the performance of subsequent low bit rate coding. Accordingly, there is a long felt but unresolved need for a method and a media processing system that implements an automatic gain control that determines and makes more accurate decisions on setting gain while taking into consideration speech portions and non-speech portions such as noise portions of an input signal, particularly in non-real time communications.

SUMMARY OF THE INVENTION

This summary is provided to introduce a selection of concepts in a simplified form that are further described below in the detailed description. This summary is not intended to identify key or essential features of the claimed subject matter, nor is it intended to be used as an aid in determining the scope of the claimed subject matter.

Methods and systems for automatic gain control are disclosed. The methods and systems disclosed herein address the above stated need for an automatic gain control that determines and makes more accurate decisions on setting gain by taking into consideration speech portions and non-speech portions such as noise portions of an input signal, particularly in non-real time communications. The method for automatic gain control disclosed herein comprises detecting a portion of an input signal corresponding to a measurement window associated with a predetermined time interval, determining a peak value of the input signal in the detected portion of the input signal during a first predetermined time segment within the measurement window, and determining a number of occurrences of the determined peak value of the input signal during a second predetermined time segment within the measurement window. The second predetermined time segment is greater than the first predetermined time segment. The method disclosed herein further comprises comparing the determined number of occurrences of the determined peak value of the input signal with a predefined range of occurrences for identifying a speech portion of the input signal corresponding to the measurement window upon the determined number of occurrences of the determined peak value of the input signal being is within the predefined range of occurrences, and for identifying a non-speech portion of the input signal corresponding to the measurement window upon the determined number of occurrences of the determined peak value of the input signal being outside the predefined range of occurrences. The method disclosed herein further comprises adjusting a gain corresponding to the first predetermined time segment of the input signal based on the determined peak value of the input signal, upon identifying the speech portion of the input signal.

The method disclosed herein employs a media processing system for automatic gain control. The media processing system comprises one or more processors and a memory storing instructions to configure the processors. The processors are configured by the instructions to execute a detection module that detects a portion of an input signal corresponding to a measurement window associated with a predetermined time interval; a peak determination module that determines a peak value of the input signal in the detected portion of the input signal during a first predetermined time segment within the measurement window applied, and determines a number of occurrences of the determined peak value of the input signal during a second predetermined time segment within the measurement window; a comparison module that compares the determined number of occurrences of the determined peak value of the input signal with a predefined range of occurrences for identifying a speech portion of the input signal corresponding to the measurement window upon the determined number of occurrences of the determined peak value of the input signal being within the predefined range of occurrences, and for identifying a non-speech portion of the input signal corresponding to the measurement window upon the determined number of occurrences of the determined peak value of the input signal being outside the predefined range of occurrences; and an adjustment module that adjusts a gain corresponding to the first predetermined time segment of the input signal based on the determined peak value of the input signal, upon identifying the speech portion of the input signal.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein comprise all such modifications.

BRIEF DESCRIPTION OF THE DRAWINGS

The embodiments herein will be better understood from the following detailed description with reference to the drawings, in which.

DETAILED DESCRIPTION OF THE INVENTION

Figure 1:
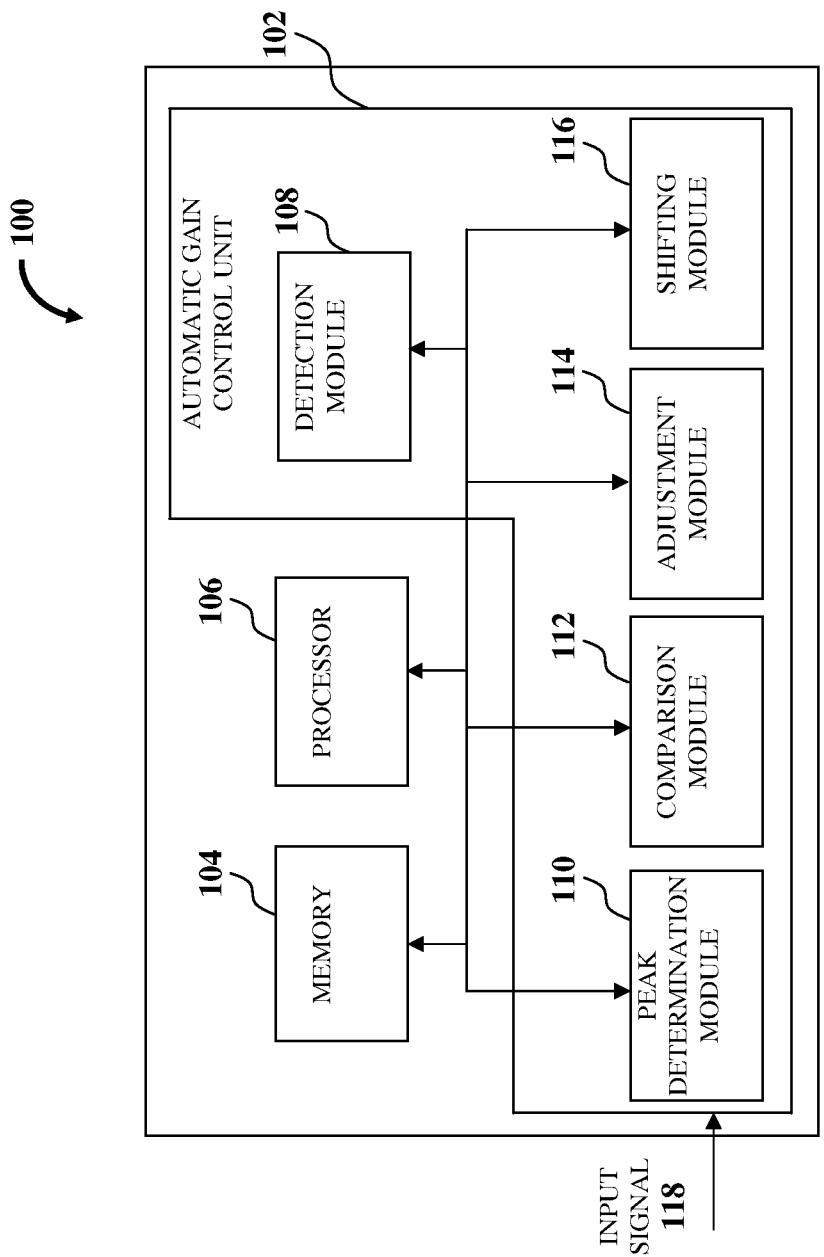
FIG. 1 exemplarily illustrates a block diagram of a media processing system, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments of the method and system disclosed herein provide a method for automatic gain control executed by a media processing system that identifies presence of either a speech portion or a non-speech portion in an input signal based on a frequency of an occurrence of a peak value and adjusts a gain applied to the input signal upon identifying the speech portion while determining an amount of the gain to be applied based on the peak value of the input signal. As used herein, "peak value" refers to the highest magnitude of an input signal. A measurement window associated with a predetermined time interval extends over a time segment of the input signal comprising both past and future values of the input signal to allow smooth transitions in the gain even with sharp changes or wide variations in the level of the input signal. As used herein, "measurement window" refers to a time segment or a time interval during which one or more values associated with an input signal may be detected and measured. Also, as used herein, "predetermined time interval" refers to a time duration of a measurement window during which one or more values associated with the input signal may be detected and measured for adjusting gain of the input signal. Referring now to the drawings, and more particularly to FIGS. 1 through 6, where similar reference characters denote corresponding features consistently throughout the figures, there are shown preferred embodiments.

FIG. 1 exemplarily illustrates a block diagram of a media processing system 100, according to an embodiment herein. As exemplarily illustrated in FIG. 1, the media processing system 100 comprises an automatic gain control unit 102, a memory 104 for storing instructions, and a processor 106 configured to execute the instructions. The memory 104 stores instructions defined by modules, for example, 108, 110, 112, 114, 116, etc., of the media processing system 100 to configure one or more processors comprising, for example, the processor 106 exemplarily illustrated in FIG. 1. In an embodiment, the automatic gain control unit 102 comprises a detection module 108, a peak determination module 110, a comparison module 112, an adjustment module 114, and a shifting module 116. In an embodiment, the processor 106 is configured by instructions to execute one or more of the detection module 108, the peak determination module 110, the comparison module 112, the adjustment module 114, and/or the shifting module 116. The automatic gain control unit 102 is configured to receive an input signal 118. The input signal 118 comprises, for example, an audio signal. The detection module 108 detects a portion of the input signal 118 corresponding to a measurement window associated with a predetermined time interval. For example, if the measurement window is of 1 second (s), the detection module 108 detects one or more values of the input signal 118 in the 1 second time interval.

The peak determination module 110 is communicatively associated with the detection module 108. The peak determination module 110 determines a peak value of the input signal 118 in the detected portion of the input signal 118 during a first predetermined time segment within the measurement window. As used herein, "predetermined time segment" refers to a time duration that is a subset of the measurement window. For example, consider a measurement window of 1 second. In this example, the first predetermined time segment is 10 milliseconds (ms). The peak determination module 110 determines a number of occurrences of the determined peak value of the input signal 118 during a second predetermined time segment within the measurement window. The second predetermined time segment is greater than the first predetermined time segment. For example, in a measurement window of 1 second, the first predetermined time segment is 10 milliseconds and the second predetermined time segment is 100 milliseconds. The peak determination module 110, for example, determines a peak value for each first predetermined time segment of 10 milliseconds of the input signal 118 within the measurement window of 1 second and a number of occurrences of the peak value for each second predetermined time segment of 100 milliseconds of the input signal 118 within the 1 second measurement window.

The comparison module 112 is communicatively associated with the peak determination module 110. The comparison module 112 compares the determined number of occurrences of the determined peak value of the input signal 118 with a predefined range of occurrences for identifying a speech portion of the input signal 118 corresponding to the measurement window upon or subsequent to the determined number of occurrences of the determined peak value of the input signal 118 being within the predefined range of occurrences, and for identifying a non-speech portion of the input signal 118 corresponding to the measurement window upon or subsequent to the determined number of occurrences of the determined peak value of the input signal 118 being outside the predefined range of occurrences. In an embodiment, the predefined range of occurrences extends between a low threshold value and a high threshold value. The low threshold value is, for example, 20 and the high threshold value is, for example, 320, in an instance where the first predetermined time segment is 10 milliseconds and the second predetermined time segment is 100 milliseconds in a measurement window of 1 second. The comparison module 112 compares the determined number of occurrences of the determined peak value with the low threshold value, for example, 20 and the high threshold value, for example, 320 to determine if the determined number of occurrences of the peak value is between the low threshold value and the high threshold value. The comparison module 112 identifies the speech portion of the input signal 118 or the non-speech portion of the input signal 118 based on the comparison.

In an embodiment, the comparison module 112 identifies the speech portion of the input signal 118 corresponding to the measurement window, upon the determined number of occurrences being within the predefined range of occurrences, for example, between 20 and 320, in the second predetermined time segment of 100 milliseconds within the 1 second measurement window. In an embodiment, the comparison module 112 identifies the non-speech portion of the input signal 118, upon the determined number of occurrences being outside the predefined range, for example, less than 20 or more than 320. The adjustment module 114 is communicatively associated with the comparison module 112. The adjustment module 114 adjusts a gain corresponding to the first predetermined time segment of the input signal 118 based on the determined peak value of the input signal 118, upon identifying the speech portion of the input signal 118. The adjustment module 114 determines an amount of adjustment to the gain based on the determined peak value. In an embodiment, the adjustment module 114 adjusts the gain to render the peak value of the input signal 118 in a range between 40 percent (%) and 60% of the determined peak value. In an embodiment, the adjustment module 114 iteratively adjusts the gain corresponding to a subsequent first predetermined time segment within the measurement window, where the subsequent first predetermined time segment is equal in duration and subsequent to the first predetermined time segment within the measurement window. In an embodiment, the adjustment module 114 maintains the gain unaltered, when the comparison module 112 identifies the non-speech portion of the input signal 118.

The shifting module 116 is communicatively associated with the detection module 108. The shifting module 116 shifts the measurement window by a predetermined time period from the predetermined time interval, for example, a first predetermined time interval to a subsequent predetermined time interval, for example, a second predetermined time interval. As used herein, "predetermined time period" refers to a time duration by which a measurement window is shifted for determining adjustment of gain of an input signal 118. Also, as used herein, "subsequent predetermined time interval" refers to a time duration associated with a shifted measurement window during which one or more values associated with the input signal 118 may be detected and measured for adjusting a gain of the input signal 118 subsequent to a previous predetermined time interval. The subsequent predetermined time interval comprises at least one or more values, hereinafter referred to as "past values", of the input signal 118 associated with the predetermined time interval.

In an embodiment, the first predetermined time interval and the second predetermined time interval may have an overlapping portion in time. Consider an example where the shifting module 116 shifts a measurement window by a predetermined time period of 10 milliseconds. In this example, if the first predetermined time interval is 5 seconds to 6 seconds of an input signal 118 and the second predetermined time interval is 5.01 seconds to 6.01 seconds of the input signal 118, then the second predetermined time interval comprises values of the input signal 118 during a time interval of 5.01 seconds to 6 seconds. Hence, the second predetermined time interval comprises values of the input signal 118 that are also present during the first predetermined time interval and therefore comprises past values of the input signal 118. In an embodiment, the second predetermined time interval also comprises one or more values, hereinafter referred to as "future values", of the input signal 118 associated with a subsequent predetermined time interval to which the measurement window may be shifted. For example, if the shifting module 116 shifts the measurement window by another predetermined time period of 10 milliseconds, then a third predetermined time interval ranges from 5.02 seconds to 6.02 seconds. The second predetermined time interval also comprises values of the input signal 118 during a time interval of 5.02 seconds to 6 seconds, that are also present in the third predetermined time interval. Hence, the second predetermined time interval also comprises future values of the input signal 118.

In an embodiment, the detection module 108 detects a subsequent portion of the input signal 118 corresponding to the shifted measurement window during the subsequent predetermined time interval, for example, the second predetermined time interval to which the measurement window is shifted. In an embodiment, the peak determination module 110 determines a subsequent peak value of the input signal 118 in the detected subsequent portion of the input signal 118 during a subsequent first predetermined time segment, for example, of 10 milliseconds of the second predetermined time interval within the shifted measurement window. In an embodiment, the subsequent first predetermined time segment is equal in duration and subsequent to the first predetermined time segment. For example, if a first predetermined time segment of a predetermined time interval associated with a measurement window is 10 milliseconds, then a subsequent first predetermined time segment of a subsequent predetermined time interval associated with a shifted measurement window is also 10 milliseconds. The peak determination module 110 further determines a subsequent number of occurrences of the determined subsequent peak value of the input signal 118 during a subsequent second predetermined time segment, for example, of 100 milliseconds of the second predetermined time interval within the shifted measurement window. The comparison module 112 compares the determined subsequent number of occurrences of the determined subsequent peak value of the input signal 118 during the subsequent second predetermined time segment within the shifted measurement window with the predefined range of occurrences, for example, between 20 and 320, for identifying a speech portion or a non-speech portion of the input signal 118 corresponding to the shifted measurement window. The comparison module 112 identifies a speech portion of the input signal 118 corresponding to the shifted measurement window, upon the determined subsequent number of occurrences of the determined subsequent peak value of the input signal 118 being within the predefined range of occurrences. The comparison module 112 identifies a non-speech portion of the input signal 118 corresponding to the shifted measurement window, upon the determined subsequent number of occurrences of the determined subsequent peak value of the input signal 118 being outside the predefined range of occurrences.

The adjustment module 114 adjusts a gain corresponding to the subsequent first predetermined time segment within the shifted measurement window of the input signal 118 based on the determined subsequent peak value of the input signal 118, when the comparison module 112 identifies the speech portion of the input signal 118 corresponding to the shifted measurement window. In an embodiment, the adjustment module 114 maintains the gain unaltered, when the comparison module 112 identifies a non-speech portion of the input signal 118 in the shifted measurement window.

In an embodiment, the adjustment module 114 iteratively determines a series of gains over an overall predetermined time interval to be applied to the input signal 118 by shifting the measurement window in steps of the predetermined time period, for example, in steps of 10 milliseconds during each iteration. As used herein, "overall predetermined time interval" refers to an accumulative period of time comprising subsequent predetermined time intervals over which automatic gain control of an input signal 118 is performed. Since the past values and the future values of the input signal 118 as described above, are considered to determine the gain, the media processing system 100 provides a predictive and automatic gain control of the input signal 118.

In an embodiment, the detection module 108, the peak determination module 110, the comparison module 112, the adjustment module 114, and the shifting module 116 are implemented as logically self-contained parts of a software program that when executed by one or more hardware processors comprising, for example, the processor 106 exemplarily illustrated in FIG. 1, perform one or more operations described above. In another embodiment, the detection module 108, the peak determination module 110, the comparison module 112, the adjustment module 114, and the shifting module 116 are implemented as self-contained hardware components.

Also, disclosed herein is a computer program product comprising a non-transitory computer readable storage medium that stores computer program codes comprising instructions executable by at least one processor 106 for automatic gain control. As used herein, "non-transitory computer readable storage medium" refers to all computer readable media, for example, non-volatile media such as optical discs or magnetic disks, volatile media such as a register memory, a processor cache, etc., transmission media such as wires, etc., that constitute a system bus coupled to the processor 106, except for a transitory and propagating signal.

The computer program product comprises a first computer program code for detecting a portion of an input signal 118, for example, an audio signal corresponding to a measurement window associated with a predetermined time interval; a second computer program code for determining a peak value of the input signal 118 in the detected portion of the input signal 118 during a first predetermined time segment within the measurement window; a third computer program code for determining a number of occurrences of the determined peak value of the input signal 118 during a second predetermined time segment within the measurement window, the second predetermined time segment being greater than the first predetermined time segment; a fourth computer program code for comparing the determined number of occurrences of the determined peak value of the input signal 118 with a predefined range of occurrences for identifying a speech portion of the input signal 118 corresponding to the measurement window upon the determined number of occurrences of the determined peak value of the input signal 118 being within the predefined range of occurrences, and for identifying a non-speech portion of the input signal 118 corresponding to the measurement window upon the determined number of occurrences of the determined peak value of the input signal 118 being outside the predefined range of occurrences; a fifth computer program code for adjusting a gain corresponding to the first predetermined time segment of the input signal 118 based on the determined peak value of the input signal 118, upon identifying the speech portion of the input signal 118; and a sixth computer program code for maintaining the gain unaltered upon identifying the non-speech portion of the input signal 118.

The first computer program code, the second computer program code, the third computer program code, the fourth computer program code, the fifth computer program code, and the sixth computer program code are executable for a subsequent first predetermined time segment within the measurement window, the subsequent first predetermined time segment being equal in duration and subsequent to the first predetermined time segment within the measurement window. The computer program product disclosed herein further comprises a seventh computer program code for iteratively determining a series of gains over an overall predetermined time interval to be applied to the input signal 118, by shifting the measurement window by a predetermined time period during each iteration and causing execution of the first computer program code, the second computer program code, the third computer program code, the fourth computer program code, the fifth computer program code, and the sixth computer program code. The measurement window is shifted from the predetermined time interval to a subsequent predetermined time interval, where the subsequent predetermined time interval comprises at least one or more values of the input signal 118 associated with the predetermined time interval.

The computer program codes comprising computer executable instructions are embodied on the non-transitory computer readable storage medium. The processor 106 of the media processing system 100 retrieves these computer executable instructions and executes them. When the computer executable instructions are executed by the processor 106, the computer executable instructions cause the processor 106 of the media processing system 100 to perform the steps of the method for automatic gain control according to various embodiments disclosed herein.

Figure 2:
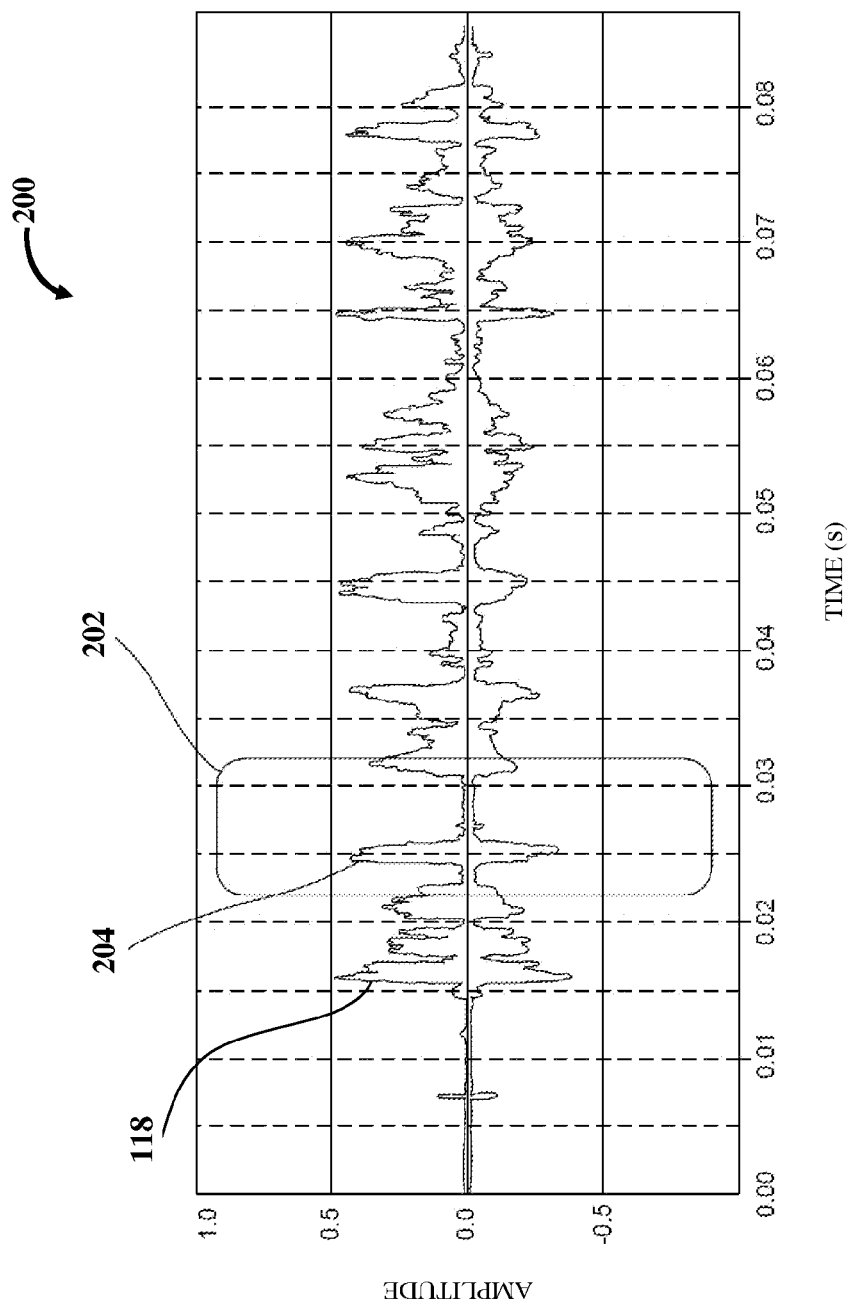
FIG. 2 exemplarily illustrates a graphical representation that illustrates a measurement window applied to an input signal and a peak determined in the input signal, according to an embodiment herein.

FIG. 2 exemplarily illustrates a graphical representation 200 that illustrates a measurement window 202 associated with a predetermined time interval of 10 milliseconds applied to an input signal 118 and a peak 204 determined in the input signal 118 within the measurement window 202, according to an embodiment herein. The peak determination module 110 of the media processing system 100 exemplarily illustrated in FIG. 1, determines the peak 204 in the input signal 118. The measurement window 202 extends over the predetermined time interval of 10 milliseconds of the input signal 118 comprising both past values and future values of the input signal 118 as disclosed in the detailed description of FIG. 1. In an embodiment, the past values and the future values are associated with an overlapping portion in time of previous portions and subsequent positions of the measurement window 202 with a current position of the measurement window 202.

Figure 3:
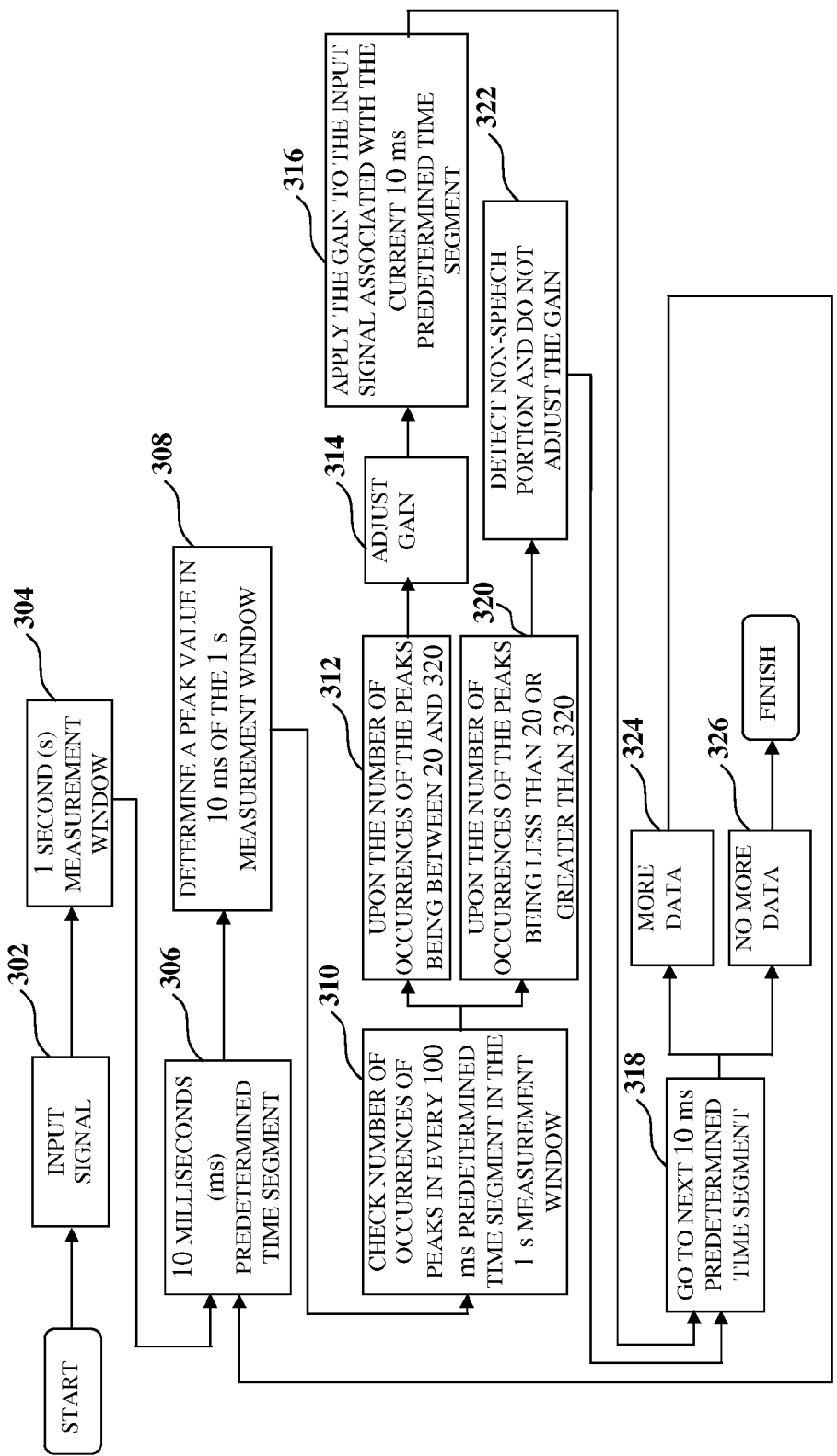
FIG. 3 exemplarily illustrates a process flow diagram depicting a process for automatic gain control implemented by the media processing system shown in FIG. 1, according to an embodiment herein.

FIG. 3 exemplarily illustrates a process flow diagram depicting a process for automatic gain control implemented by the media processing system 100 shown in FIG. 1, according to an embodiment herein. The media processing system 100 comprises an automatic gain control unit 102 comprising a detection module 108, a peak determination module 110, a comparison module 112, an adjustment module 114, and a shifting module 116 as exemplarily illustrated in FIG. 1 and as disclosed in the detailed description of FIG. 1. In step 302, the automatic gain control unit 102 receives an input signal 118 exemplarily illustrated in FIGS. 1-2. In step 304, the detection module 108 detects one or more values of the input signal 118 during a 1 second measurement window of the input signal 118. In step 306, the detection module 108 selects one or more values of the input signal 118 during a first predetermined time segment of 10 milliseconds within the 1 second measurement window. In step 308, the peak determination module 110 determines a peak value, for example, from among the values of the input signal 118 during the 10 milliseconds predetermined time segment within the 1 second measurement window. In step 310, the peak determination module 110 determines a number of occurrences of the peak value or a number of peaks for every second predetermined time segment of 100 milliseconds in the 1 second measurement window. In step 312, the comparison module 112 checks whether, in any predetermined time segment, the number of peaks is within a predefined range, for example, greater than or equal to 20 or less than or equal to 320.

If the number of occurrences of the peak value is within the predefined range, the comparison module 112 detects a speech-portion in the input signal 118. The adjustment module 114 adjusts a gain of the input signal 118 in step 314, and applies the adjusted gain or peak of the input signal 118 to the input signal 118 associated with the current 10 milliseconds predetermined time segment in step 316. In step 318, the process moves to the next 10 milliseconds predetermined time segment within the 1 second measurement window and the steps from 306 onwards are repeated. The steps 306 to 318 are repeated iteratively for every subsequent 10 milliseconds shift in the position of the measurement window. Else, if in step 320, the comparison module 112 determines that the number of occurrences of the peak value or the number of peaks is outside the predefined range, for example, less than 20 or greater than 320, then in step 322, the comparison module 112 detects a non-speech portion of the input signal 118 and accordingly, the adjustment module 114 does not adjust the gain, and the process goes back to step 318 for detecting the values associated with the next 10 milliseconds predetermined time segment within the 1 second measurement window. In step 324, the detection module 108 checks whether there is any more data or values of the input signal 118 associated with subsequent predetermined time segments of the input signal 118 within the 1 second measurement window. If the subsequent predetermined time segments have more data, the control shifts to step 306 and the process continues as disclosed above. Else, if there is no more data or values of the input signal 118 associated with subsequent predetermined time segments within the measurement window, then the process ends at step 326.

Figure 4:
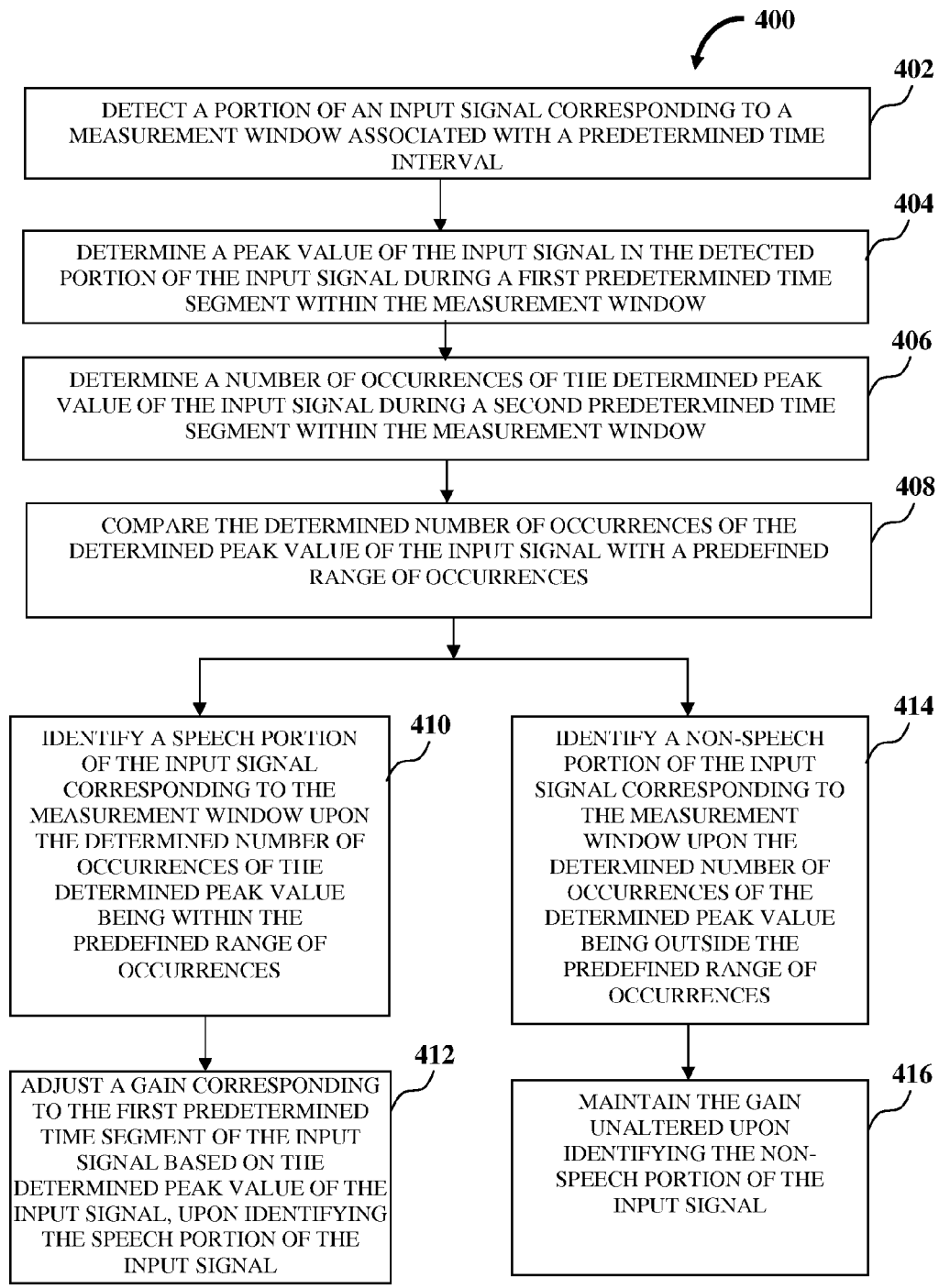
FIG. 4 illustrates a flow chart illustrating a method for automatic gain control, according to an embodiment herein.

FIG. 4 illustrates a flowchart 400 illustrating a method for automatic gain control, according to an embodiment herein. Operations of the media processing system 100 illustrated in the flowchart 400, and combinations of the operations illustrated in the flowchart 400, may be implemented by various means, such as hardware, firmware, a processor, a circuitry and/or other devices associated with execution of software comprising one or more computer program instructions. The operations of the method disclosed herein are executed by the media processing system 100 exemplarily illustrated in FIG. 1. However, the operations of the method can be described and/or practiced by using any other system.

The method starts at operation 402. At operation 402, the detection module 108 exemplarily illustrated in FIG. 1, detects a portion of an input signal, for example, an audio signal, corresponding to a measurement window associated with a predetermined time interval. For example, if the measurement window is of 1 second, the detection module 108 detects one or more values of the input signal in the 1 second predetermined time interval at operation 402. At operation 404, the peak determination module 110 exemplarily illustrated in FIG. 1, determines a peak value of the input signal in the detected portion of the input signal during a first predetermined time segment within the measurement window. In an example, if a measurement window is of 1 second, then the first predetermined time segment is 10 milliseconds. At operation 406, the peak determination module 110 determines a number of occurrences of the determined peak value of the input signal during a second predetermined time segment within the measurement window. In an embodiment, the second predetermined time segment is greater than the first predetermined time segment. For example, in a measurement window of 1 second, the first predetermined time segment is 10 milliseconds and the second predetermined time segment is 100 milliseconds. In this example, the peak determination module 110 determines a peak value for each first predetermined time segment of 10 milliseconds of the input signal within the measurement window of 1 second and a number of occurrences of the peak value for each second predetermined time segment of 100 milliseconds of the input signal within the 1 second measurement window.

At operation 408, the comparison module 112 exemplarily illustrated in FIG. 1, compares the determined number of occurrences of the determined peak value of the input signal with a predefined range of occurrences extending between a low threshold value of, for example, 20 and a high threshold value of, for example, 320. Based on the comparison, the comparison module 112 identifies a speech portion of the input signal corresponding to the measurement window upon the determined number of occurrences of the determined peak value of the input signal being within the predefined range of occurrences, for example, between 20 and 320 in a 1 second measurement window at operation 410, and identifies a non-speech portion, for example, a noise of the input signal corresponding to the measurement window upon the determined number of occurrences of the determined peak value of the input signal being outside the predefined range of occurrences, for example, less than 20 and more than 320 in the 1 second measurement window, at operation 414. At operation 412, the adjustment module 114 exemplarily illustrated in FIG. 1, adjusts a gain corresponding to the first predetermined time segment of the input signal based on the determined peak value of the input signal, upon identifying the speech portion of the input signal at operation 410. Upon identifying the non-speech portion of the input signal at operation 414, the adjustment module 114 maintains the gain unaltered for the input signal at operation 416.

In an embodiment, the operations 404 to 416 are repeated by the respective modules, for example, the detection module 108, the peak determination module 110, the comparison module 112, and the adjustment module 114 of the media processing system 100 exemplarily illustrated in FIG. 1, for a subsequent first predetermined time segment, where the subsequent first predetermined time segment is equal in duration and subsequent to the first predetermined time segment within the measurement window. For example, in a 1 second measurement window, if the operations 404 to 416 are performed for the first predetermined time segment of 10 milliseconds, then in the next iteration, the operations 404 to 416 are performed for a subsequent first predetermined time segment, that is, from 10 milliseconds to 20 milliseconds time interval within the 1 second measurement window. Upon completing all the time segments within a given measurement window, the shifting module 116 shifts the measurement window by a predetermined time period during each iteration. The adjustment module 114 determines a series of gains over an overall predetermined time interval to be applied to the input signal by iteratively performing operations 404 to 416 for the shifted measurement window. The adjustment module 114 determines the series of gains by shifting the measurement window by the predetermined time period during subsequent iterations.

The shifting module 116 shifts the measurement window by the predetermined time period during each iteration by shifting the measurement window from the predetermined time interval, for example, a first predetermined time interval to a subsequent predetermined time interval, for example, a second predetermined time interval. The second predetermined time interval comprises at least one or more values of the input signal associated with the first predetermined time interval. Hence, the first predetermined time interval and the second predetermined time interval may have an overlapping portion in time. For example, if the first predetermined time interval is 5 milliseconds to 15 milliseconds of an input signal and the second predetermined time interval is 10 milliseconds to 20 milliseconds of the input signal, then the second predetermined time interval comprises values of the input signal during the time interval of 10 milliseconds to 15 milliseconds that are also present during the first predetermined time interval, and therefore comprises past values of the input signal. Similarly, the second predetermined time interval may also comprise future values associated with a subsequent predetermined time interval to which the measurement window may be shifted subsequently. For example, if a third predetermined time interval extends from 12 milliseconds to 22 milliseconds of the input signal, then the second predetermined time interval comprises values of the input signal during the time interval of 12 milliseconds to 15 milliseconds that are also present during the third predetermined time interval, and therefore comprises future values of the input signal. Since the future values of the input signal are also considered for determining the gain, the method as disclosed in the detailed description of FIG. 4, is predictive in nature. The adjustment module 114 iteratively determines a series of gains over an overall predetermined time interval to be applied to the input signal by shifting the measurement window in time and iteratively performing operations 404 to 416 for each position of the measurement window in the overall predetermined time interval.

Figure 5:
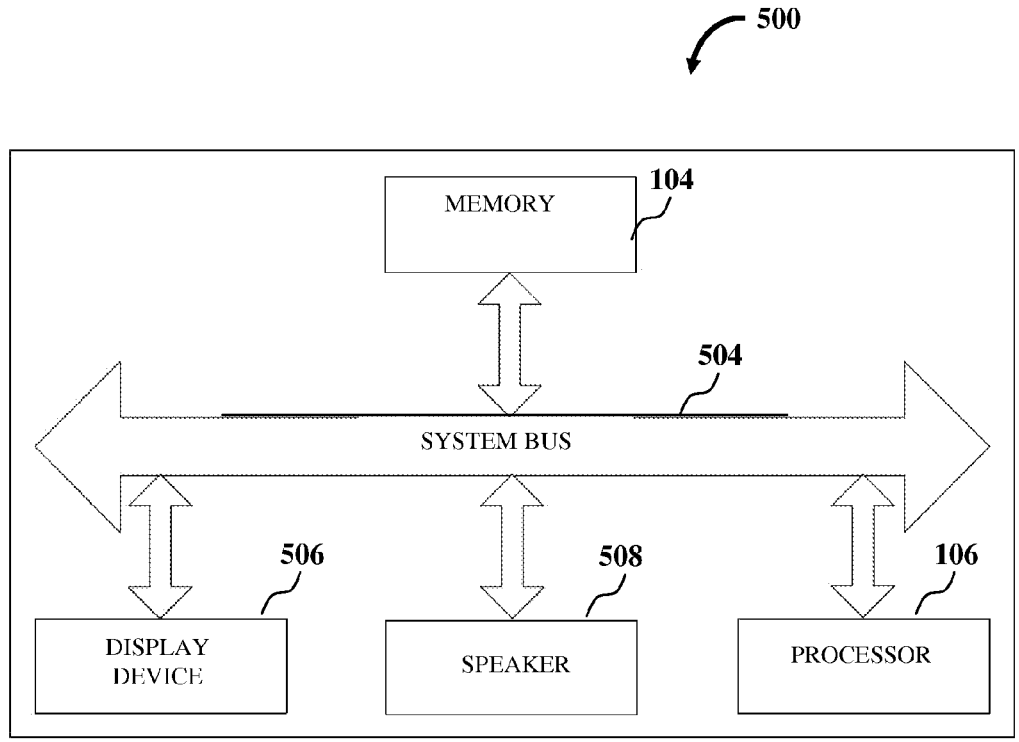
FIG. 5 exemplarily illustrates a hardware architecture of the media processing system shown in FIG. 1, used in accordance with the embodiments herein.

FIG. 5 exemplarily illustrates a hardware architecture 500 of the media processing system 100 shown in FIG. 1, used in accordance with the embodiments herein. The hardware architecture 500 of the media processing system 100 comprises a memory 104 for storing a set of instructions defined by the modules, for example, 108, 110, 112, 114, 116, etc., of the media processing system 100 exemplarily illustrated in FIG. 1, a system bus 504, a display device 506, a speaker 508, and a processor 106 capable of processing the set of instructions to perform one or more of the methods, according to an embodiment herein. In an embodiment, the processor 106 processes digital content to be consumed, for example, in the form of video as output via one or more display devices 506 or audio as output via the speaker 508 and/or earphones (not shown). The processor 106 executes the set of instructions defined by the modules, for example, 108, 110, 112, 114, 116, etc., of the media processing system 100 for performing the method disclosed herein and in accordance with the embodiments herein.

In an embodiment, the memory 104 stores digital content for future processing or consumption. In an embodiment, the memory 104 stores program specific information (PSI) and/or service information (SI), comprising information about the digital content, for example, detected information bits available in the future values or stored from the past values of the input signal as disclosed in the detailed description of FIG. 1. A user of the media processing system 100 may view the stored information on the display device 506 and select an item, for example, for viewing, listening, or other uses via input devices comprising, for example, a keypad, a scroll, other input devices, or any combinations thereof. When the digital content is selected, the processor 106 processes information from the digital content. In an embodiment, an adjusted input signal is coded using a low bit rate coder and then sent to a remote server and, hence, to an end user associated with the media processing system 100.

Figure 6:
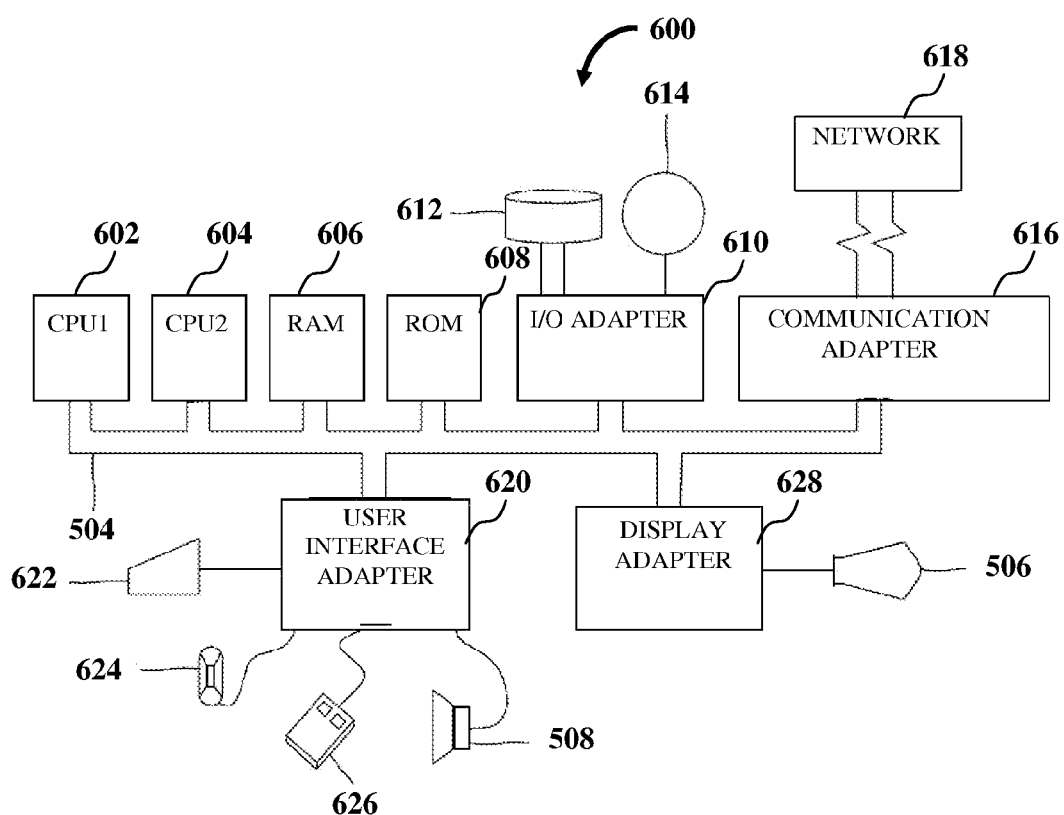
FIG. 6 exemplarily illustrates a schematic diagram of the computer architecture employed by the media processing system shown in FIG. 1, for automatic gain control, according to an embodiment herein.

FIG. 6 exemplarily illustrates a schematic diagram of the computer architecture 600 employed by the media processing system 100 shown in FIG. 1, for automatic gain control, according to an embodiment herein. A representative hardware environment for practicing the embodiments disclosed herein is exemplarily illustrated in FIG. 6. The schematic drawing illustrates a hardware configuration of an information handling computer system in accordance with the embodiments herein. The computer system comprises at least one processor 106 exemplarily illustrated in FIG. 1 and FIG. 5, for example, a central processing unit 1 (CPU 1) 602 and a CPU 2 604 exemplarily illustrated in FIG. 6. The CPU 1 602 and the CPU 2 604 are interconnected via a system bus 504 to various devices such as a random access memory (RAM) 606, a read-only memory (ROM) 608, and an input/output (I/O) adapter 610. The I/O adapter 610 may be connected to peripheral devices, for example, disk units 612 and tape drives 614, or other program storage devices that are readable by the computer system. The computer system may read the instructions defined by the modules, for example, 108, 110, 112, 114, 116, etc., of the media processing system 100 exemplarily illustrated in FIG. 1, on the program storage devices and follow the instructions to execute the methodology of the embodiments herein.

The computer system further comprises a user interface adapter 620 that connects, for example, a keyboard 622, a mouse 626, a speaker 508, a microphone 624, and/or other user interface devices such as a touch screen device (not shown) or a remote control to the system bus 504 to gather user input. Additionally, a communication adapter 616 connects the system bus 504 to a data processing network 618. A display adapter 628 connects the system bus 504 to a display device 506 which may be embodied as an output device such as a monitor, a printer, a transmitter, etc.

The media processing system 100 uses past values and future values of an input signal in the measurement window and a frequency of occurrences of peak values in predetermined time segments to distinguish between speech portions and non-speech portions, for example, noise of the input signal. The media processing system 100 accordingly adjusts a gain for the speech portions of the input signal while maintaining the gain unaltered for the non-speech portions of the input signal as disclosed in the detailed description of FIG. 1. The method disclosed herein is repeated in steps within the measurement window and later by shifting the measurement window in small steps in time, therefore enabling an accurate and smooth adjustment of gain for input signals even with sharp changes of input levels or wide variations in input levels from an optimum input level. In an embodiment, the method and the media processing system 100 disclosed herein enable selective adjustment of gain in time segments within a measurement window associated with speech portions of an input signal, and no adjustment for time segments within a measurement window associated with non-speech portions, for example, noise, of the input signal. The input is the input signal and the output is the gain adjusted signal, so there is a transformation as the gain of the input signal is adjusted. In an embodiment, the method and the media processing system 100 disclosed herein may be used for controlling wide variations in recording levels of audio messages, for example, voice messages recorded via a mobile communication device.

Although the methods and systems disclosed herein have been described with reference to specific exemplary embodiments, it is noted that various modifications and changes may be made to these embodiments without departing from the broad spirit and scope of the methods and systems disclosed herein. For example, the various devices, modules, etc., described herein may be enabled and operated using hardware circuitry, for example, complementary metal oxide semiconductor (CMOS) based logic circuitry, firmware, software and/or any combination of hardware, firmware, and/or software, for example, embodied in a machine-readable medium. For example, various electrical structures and methods may be embodied using transistors, logic gates, and electrical circuits, for example, in application specific integrated circuit (ASIC) circuitry and/or in digital signal processor (DSP) circuitry.

Particularly, the media processing system 100 and various modules, for example, 108, 110, 112, 114, 116, etc., exemplarily illustrated in FIG. 1, associated with the media processing system 100 may be enabled using software and/or using transistors, logic gates, and electrical circuits, for example, integrated circuit circuitry such as ASIC circuitry. Also, techniques, devices, subsystems, and methods described and illustrated in the various embodiments as discrete or separate may be combined or integrated with other systems, modules, techniques, or methods without departing from the scope of the method and system disclosed herein. Other items shown or discussed as directly coupled or communicating with each other may be coupled through some interface or device, such that the items may no longer be considered directly coupled with each other but may still be indirectly coupled and in communication, whether electrically, mechanically, or otherwise, with one another. Other examples of changes, substitutions, and alterations ascertainable by one skilled in the art, upon or subsequent to studying the exemplary embodiments disclosed herein, may be made without departing from the spirit and scope of the method and system disclosed herein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

I claim:

1. A method for automatic gain control, said method comprising:
(a) detecting a portion of an input signal corresponding to a measurement window associated with a predetermined time interval;
(b) determining a peak value of said input signal in said detected portion of said input signal during a first predetermined time segment within said measurement window;
(c) determining a number of occurrences of said determined peak value of said input signal during a second predetermined time segment within said measurement window, wherein said second predetermined time segment is greater than said first predetermined time segment;
(d) comparing said determined number of occurrences of said determined peak value of said input signal with a predefined range of occurrences for identifying a speech portion of said input signal corresponding to said measurement window upon said determined number of occurrences of said determined peak value of said input signal being within said predefined range of occurrences, and for identifying a non-speech portion of said input signal corresponding to said measurement window upon said determined number of occurrences of said determined peak value of said input signal being outside said predefined range of occurrences; and
(e) adjusting a gain corresponding to said first predetermined time segment of said input signal based on said determined peak value of said input signal, upon identifying said speech portion of said input signal.

2. The method of claim 1, further comprising:
(f) maintaining said gain unaltered upon identifying said non-speech portion of said input signal.

3. The method of claim 2, further comprising:
(g) performing steps (a) through (f) for a subsequent first predetermined time segment, wherein said subsequent first predetermined time segment is equal in duration and subsequent to said first predetermined time segment within said measurement window.

4. The method of claim 3, further comprising iteratively determining a series of gains over an overall predetermined time interval for said input signal, by performing steps (a) through (g) by shifting said measurement window by a predetermined time period during each iteration.

5. The method of claim 4, wherein said shifting of said measurement window by said predetermined time period during said each iteration comprises shifting said measurement window from said predetermined time interval to a subsequent predetermined time interval, wherein said subsequent predetermined time interval comprises at least one or more values of said input signal associated with said predetermined time interval.

6. The method of claim 1, wherein said predefined range of occurrences is between 20 and 320 in said second predetermined time segment of 100 milliseconds of said measurement window of 1 second.

7. A media processing system for automatic gain control, said media processing system comprising:
one or more processors;

a memory storing instructions defined by modules of said media processing system to configure said one or more processors, wherein said one or more processors are configured to execute said defined instructions; and said modules of said media processing system comprising:

a detection module configured to detect a portion of an input signal corresponding to a measurement window associated with a predetermined time interval;

a peak determination module communicatively associated with said detection module, said peak determination module configured to determine a peak value of said input signal in said detected portion of said input signal during a first predetermined time segment within said measurement window;

said peak determination module further configured to determine a number of occurrences of said determined peak value of said input signal during a second predetermined time segment within said measurement window, wherein said second predetermined time segment is greater than said first predetermined time segment;

a comparison module communicatively associated with said peak determination module, said comparison module configured to compare said determined number of occurrences of said determined peak value of said input signal with a predefined range of occurrences for identifying a speech portion of said input signal corresponding to said measurement window upon said determined number of occurrences of said determined peak value of said input signal being within said predefined range of occurrences, and for identifying a non-speech portion of said input signal corresponding to said measurement window upon said determined number of occurrences of said determined peak value of said input signal being outside said predefined range of occurrences; and an adjustment module communicatively associated with said comparison module, said adjustment module configured to adjust a gain corresponding to said first predetermined time segment of said input signal based on said determined peak value of said input signal, upon identifying said speech portion of said input signal.

8. The media processing system of claim 7, wherein said adjustment module is further configured to maintain said gain unaltered upon identifying said non-speech portion of said input signal.

9. The media processing system of claim 7, wherein said adjustment module is further configured to iteratively adjust said gain corresponding to a subsequent first predetermined time segment within said measurement window, wherein said subsequent first predetermined time segment is equal in duration and subsequent to said first predetermined time segment within said measurement window.

10. The media processing system of claim 7, wherein said modules of said media processing system further comprise a shifting module communicatively associated with said detection module, wherein said shifting module is configured to shift said measurement window by a predetermined time period from said predetermined time interval to a subsequent predetermined time interval, wherein said subsequent predetermined time interval comprises at least one or more values of said input signal associated with said predetermined time interval, and wherein said detection module is further configured to detect a subsequent portion of said input signal corresponding to said shifted measurement window during said subsequent predetermined time interval.

11. The media processing system of claim 10, wherein said peak determination module is further configured to:

determine a subsequent peak value of said input signal in said detected subsequent portion of said input signal during a subsequent first predetermined time segment within said shifted measurement window; and determine a subsequent number of occurrences of said determined subsequent peak value of said input signal during a subsequent second predetermined time segment within said shifted measurement window.

12. The media processing system of claim 11, wherein said comparison module is further configured to compare said determined subsequent number of occurrences of said determined subsequent peak value of said input signal during said subsequent second predetermined time segment within said shifted measurement window with the predefined range of occurrences for identifying a speech portion of said input signal corresponding to said shifted measurement window upon said determined subsequent number of occurrences of said determined subsequent peak value of said input signal being within said predefined range of occurrences, and identifying a non-speech portion of said input signal corresponding to said shifted measurement window upon said determined subsequent number of occurrences of said determined subsequent peak value of said input signal being outside said predefined range of occurrences.

13. The media processing system of claim 11, wherein said adjustment module is further configured to adjust a gain corresponding to said subsequent first predetermined time segment of said input signal based on said determined subsequent peak value of said input signal, upon identifying a speech portion of said input signal corresponding to said shifted measurement window.

14. The media processing system of claim 10, wherein said adjustment module is further configured to iteratively determine a series of gains over an overall predetermined time interval for said input signal based on said shifting of said measurement window by said predetermined time period during each iteration.

15. The media processing system of claim 7, wherein said predefined range of occurrences is between 20 and 320 in said second predetermined time segment of 100 milliseconds of said measurement window of 1 second.

16. A computer program product comprising a non-transitory computer readable storage medium, said non-transitory computer readable storage medium storing computer program codes comprising instructions executable by at least one processor, said computer program codes comprising:

a first computer program code for detecting a portion of an input signal corresponding to a measurement window associated with a predetermined time interval;

a second computer program code for determining a peak value of said input signal in said detected portion of said input signal during a first predetermined time segment within said measurement window;

a third computer program code for determining a number of occurrences of said determined peak value of said input signal during a second predetermined time segment within said measurement window, wherein said second predetermined time segment is greater than said first predetermined time segment;

a fourth computer program code for comparing said determined number of occurrences of said determined peak value of said input signal with a predefined range of occurrences for identifying a speech portion of said input signal corresponding to said measurement window upon said determined number of occurrences of said determined peak value of said input signal being within said predefined range of occurrences, and for identifying a non-speech portion of said input signal corresponding to said measurement window upon said determined number of occurrences of said determined peak value of said input signal being outside said predefined range of occurrences;

a fifth computer program code for adjusting a gain corresponding to said first predetermined time segment of said input signal based on said determined peak value of said input signal, upon identifying said speech portion of said input signal; and a sixth computer program code for maintaining said gain unaltered upon identifying said non-speech portion of said input signal.

17. The computer program product of claim 16, wherein said first computer program code, said second computer program code, said third computer program code, said fourth computer program code, said fifth computer program code, and a sixth computer program code are executable for a subsequent first predetermined time segment within said measurement window, wherein said subsequent first predetermined time segment is equal in duration and subsequent to said first predetermined time segment within said measurement window.

18. The computer program product of claim 16, further comprising a seventh computer program code for iteratively determining a series of gains over an overall predetermined time interval for said input signal by shifting said measurement window by a predetermined time period during each iteration and causing execution of said first computer program code, said second computer program code, said third computer program code, said fourth computer program code, said fifth computer program code, and said sixth computer program code, wherein said shifting of said measurement window by said predetermined time period during said each iteration comprises shifting said measurement window from said predetermined time interval to a subsequent predetermined time interval, wherein said subsequent predetermined time interval comprises at least one or more values of said input signal associated with said predetermined time interval.

19. The computer program product of claim 16, wherein said predefined range of occurrences is between 20 and 320 in said second predetermined time segment of 100 milliseconds of said measurement widow of 1 second.

20. The computer program product of claim 16, wherein said first predetermined time segment is 10 milliseconds and said second predetermined time segment is 100 milliseconds for said measurement window of 1 second.

* * * * *